US010134676B2

(12) United States Patent
Lee et al.

(10) Patent No.: US 10,134,676 B2
(45) Date of Patent: Nov. 20, 2018

(54) FLEXIBLE DEVICE HAVING FLEXIBLE INTERCONNECT LAYER USING TWO-DIMENSIONAL MATERIALS

(71) Applicant: Samsung Electronics Co., Ltd., Suwon-si, Gyeonggi-do (KR)

(72) Inventors: Jaeho Lee, Seoul (KR); Taeho Kim, Suwon-si (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/932,439

(22) Filed: Nov. 4, 2015

(65) Prior Publication Data

US 2016/0343670 A1     Nov. 24, 2016

(30) Foreign Application Priority Data

May 21, 2015   (KR) .................. 10-2015-0071140

(51) Int. Cl.
*H01L 23/532*     (2006.01)
*H01L 23/498*     (2006.01)

(52) U.S. Cl.
CPC .... *H01L 23/53276* (2013.01); *H01L 23/4985* (2013.01); *H01L 23/5328* (2013.01)

(58) Field of Classification Search
CPC ............. H01L 23/53276; H01L 23/481; H01L 23/528; H01L 23/53209; H01L 23/5328; H01L 23/5387
USPC ........................................................ 257/746
See application file for complete search history.

(56) References Cited

U.S. PATENT DOCUMENTS

| 5,527,741 | A | 6/1996 | Cole et al. |
|---|---|---|---|
| 7,273,987 | B2 | 9/2007 | Becker et al. |
| 8,513,532 | B2 | 8/2013 | Chen et al. |
| 2004/0192082 | A1 | 9/2004 | Wagner et al. |
| 2011/0026232 | A1* | 2/2011 | Lin .................. H01L 21/76898 361/760 |
| 2014/0098567 | A1* | 4/2014 | Nakai .................. G02B 6/0045 362/613 |
| 2014/0264938 | A1 | 9/2014 | Hackler, Sr. et al. |

FOREIGN PATENT DOCUMENTS

| KR | 20130023941 A | 3/2013 |
|---|---|---|
| KR | 20130039119 A | 4/2013 |
| KR | 101441235 B1 | 9/2014 |

OTHER PUBLICATIONS

M. Pourfath: Numerical Study of Quantum Transport in Carbon Nanotube-Based Transistors, PhD Dissertation, 2007.*

(Continued)

*Primary Examiner* — Yasser A Abdelaziez
(74) *Attorney, Agent, or Firm* — Harness, Dickey & Pierce, P.L.C.

(57) ABSTRACT

A flexible device includes an electronic device having an electrode and a flexible interconnect layer formed on the electrode. The flexible interconnect layer includes a two-dimensional (2D) material and a conductive polymer to have high electric conductivity and flexibility. The flexible device includes a flexible interconnect layer of one or more layers, and in this case, includes a low-dielectric constant dielectric layer between the respective layers.

16 Claims, 19 Drawing Sheets

(56) References Cited

OTHER PUBLICATIONS

Pourfath ("Numerical Study of Quantum Transport in Carbon Nanotube Transistor", PhD dissertation, 2007), (hereinafter, Pourfath).*
Kim, Dae-Hyeong, et al., "Flexible and Stretchable Electronics for Biointegrated Devices," Annual Review of Biomedical Engineering, vol. 14, 2012, pp. 113-128.
Rogers, John A., et al., "Materials and Mechanics for Stretchable Electronics," Science, vol. 327, 2010, pp. 1603-1607.

* cited by examiner

FLEXIBLE DEVICE HAVING FLEXIBLE INTERCONNECT LAYER USING TWO-DIMENSIONAL MATERIALS

CROSS-REFERENCE TO RELATED APPLICATION

This application claims the benefit of priority from Korean Patent Application No. 10-2015-0071140, filed on May 21, 2015, in the Korean Intellectual Property Office, the disclosure of which is incorporated herein in its entirety by reference.

BACKGROUND

1. Field

Example embodiments relate to a flexible device having a flexible interconnect layer using two-dimensional (2D) materials.

2. Description of the Related Art

Recently, research has been actively conducted on next-generation materials including two-dimensional (2D) materials such as graphene, carbon nanotube (CNT), and so forth. Graphene is a hexagonal mono-layer structure composed of carbon atoms, showing structurally/chemically stable and electrically/physically excellent characteristics. For example, graphene may have a charge carrier mobility (~2×105 cm2/Vs) that is faster than the charge carrier mobility of silicon (Si) by about 100 times or more, and a current density (about 108 A/cm2) that is higher than the current density of coper (Cu) by about 100 times or more. Moreover, graphene has good flexibility and transparency.

Due to various advantages of next-generation materials such as graphene, their application to various semiconductor devices and electronic devices has been studied. For example, in studies of flexible devices for development of wearable devices, application of 2D materials such as graphene or transition metal dichalcogenide (TMD) has been continuously attempted.

SUMMARY

Example embodiments relate to a flexible device having a flexible interconnect layer using a two-dimensional (2D) material for an interconnect line between electronic devices.

Additional example embodiments will be set forth in part in the description which follows and, in part, will be apparent from the description, or may be learned by practice of the example embodiments.

According to an example embodiment, a flexible device includes a substrate, an electronic device formed on the substrate and including an electrode, and a first flexible interconnect layer formed on the electrode and including a first two-dimensional (2D) material layer and a first conductive polymer layer formed on the first 2D material layer.

The first flexible interconnect layer may include a pattern for electrical interconnection.

The pattern may include a two-dimensional (2D) pattern.

The first flexible interconnect layer may be structured such that the first 2D material layer and the first conductive polymer layer are arranged in that order from the electrode.

The first flexible interconnect layer may be structured such that the first conductive polymer layer and the 2D material layer are arranged in that order from the electrode.

The first flexible interconnect layer may further include a second conductive polymer layer, and may be structured such that the first conductive polymer layer, the first 2D material layer, and the second conductive polymer layer are arranged in that order from the electrode.

The flexible device may further include a low-dielectric constant dielectric layer formed on the first flexible interconnect layer, a through electrode passing through the low-dielectric constant dielectric layer and contacting the first flexible interconnect layer, and a second flexible interconnect layer formed on the through electrode and including a second 2D material layer and a third conductive polymer layer formed on the second 2D material layer.

The second flexible interconnect layer may be structured such that the second 2D material layer and the third conductive polymer layer are arranged in that order from the through electrode.

The second flexible interconnect layer may be structured such that the third conductive polymer layer and the second 2D material layer are arranged in that order from the through electrode.

The second flexible interconnect layer may further include a fourth conductive polymer layer, and may be structured such that the third conductive polymer layer, the second 2D material layer, and the fourth conductive polymer layer are arranged in that order from the through electrode.

The first 2D material layer may include at least one of graphene and transition-metal dichalcogenide (TMD).

The conductive polymer layer may include a flexible polymer.

The flexible polymer may include at least one of 3,4-ethylenedioxythiophene, polyaniline, 3,4-poly[3,4-ethylenedioxythiophene]-polystyrenesufonate (PEDOT), poly-phenylenevinylene, polyacetylene, polythiophene, polypyrrole, polyphenylene sulfide, polyalkylthiophene, polyindole, and polypyrene.

The flexible device may further include a passivation layer protecting the flexible device.

The passivation layer may include the same material as the substrate.

The passivation layer may include at least one of an oxide layer, polyimide (PI), epoxy, and a silicon elastomer.

The substrate may include at least one of polyethylenenaphthalate (PEN), polyethyleneterephthalate (PET), polycarbonate, polyvinylalcohol, polyacrylate, polyimide, and polynorbornene, polyethersulfone (PES).

According to an example embodiment, a flexible device includes a first electronic device and a second electronic device spaced apart from each other and a first flexible interconnect layer connecting an electrode of the first electronic device with an electrode of the second electronic device and including a two-dimensional (2D) material layer and a conductive polymer layer formed on the 2D material layer.

The flexible device may further include a low-dielectric constant dielectric layer formed on the first flexible interconnect layer, a through electrode passing through the low-dielectric constant dielectric layer and contacting the first flexible interconnect layer, and a second flexible interconnect layer formed on the through electrode and including a 2D material layer and a conductive polymer layer formed on the 2D material layer.

The flexible device may further include a third electronic device electrically connected to the second flexible interconnect layer.

BRIEF DESCRIPTION OF THE DRAWINGS

These and/or other example embodiments will become apparent and more readily appreciated from the following description taken in conjunction with the accompanying drawings in which.

DETAILED DESCRIPTION

Figure 1:
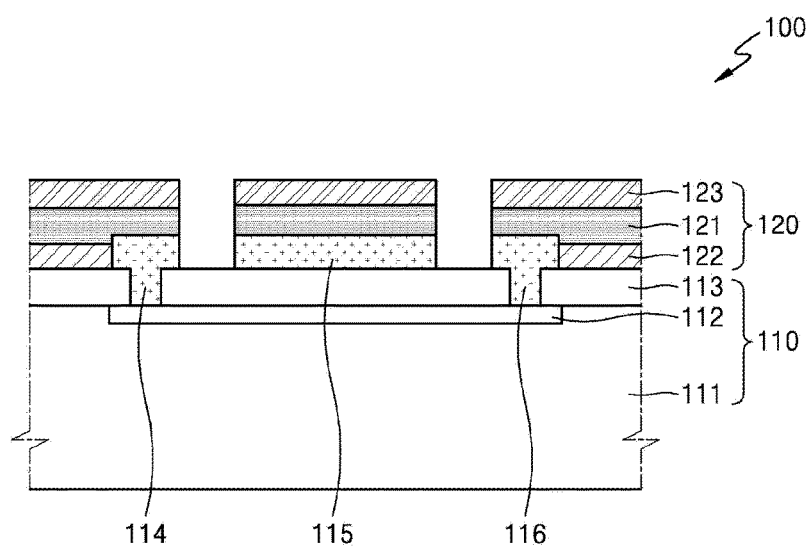
FIG. 1 is a cross-sectional view showing a schematic structure of a flexible device according to an example embodiment.

Reference will now be made in detail to example embodiments illustrated in the accompanying drawings, wherein like reference numerals refer to like elements throughout. In this regard, the example embodiments may have different forms and should not be construed as being limited to the descriptions set forth herein. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Hereinafter, a flexible device interconnect line including a two-dimensional (2D) material will be described in detail with reference to the attached drawings. Throughout the drawings, like reference numerals indicate like components, and the sizes of the components may be exaggerated for clarity and convenience of description. In addition, the example embodiments described below are merely examples, and various modifications may be possible.

Hereinafter, example embodiments will be described in detail with reference to the attached drawings, and when a description is made with reference to the drawings, identical or corresponding components will be given identical or corresponding reference numerals and a repetitive description thereof will not be provided.

The terms used in the present application are merely used to describe an example embodiment, and are not intended to limit the present invention. Use of singular forms includes plural references as well, unless expressly specified otherwise.

The terms used in the present application are merely used to describe an example embodiment, and are not intended to limit the present invention. Use of singular forms includes plural references as well, unless expressly in of one or more other features, numbers, steps, operations, elements, components, and/or combinations thereof.

Figure 2:
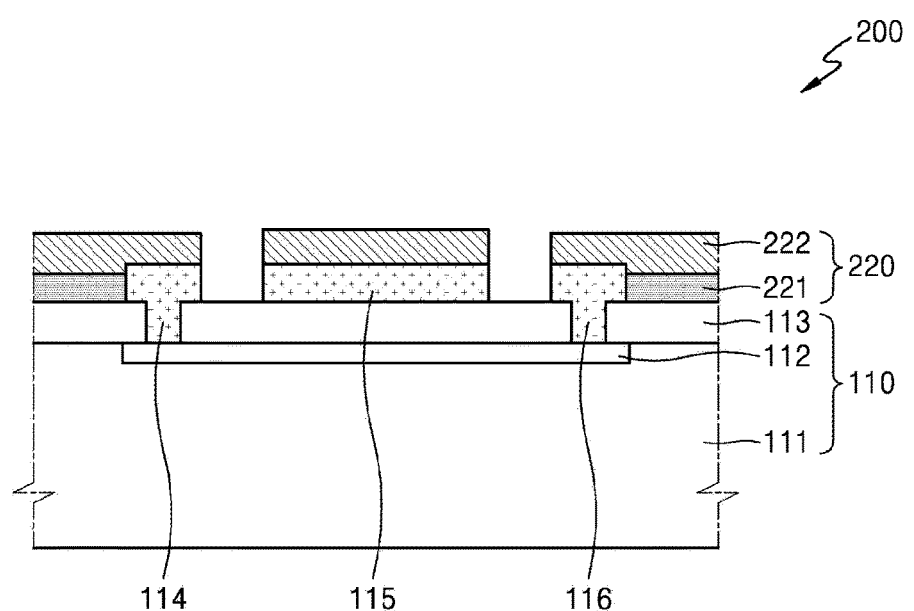
FIG. 2 is a cross-sectional view showing a schematic structure of a flexible device according to another example embodiment.
Figure 3:
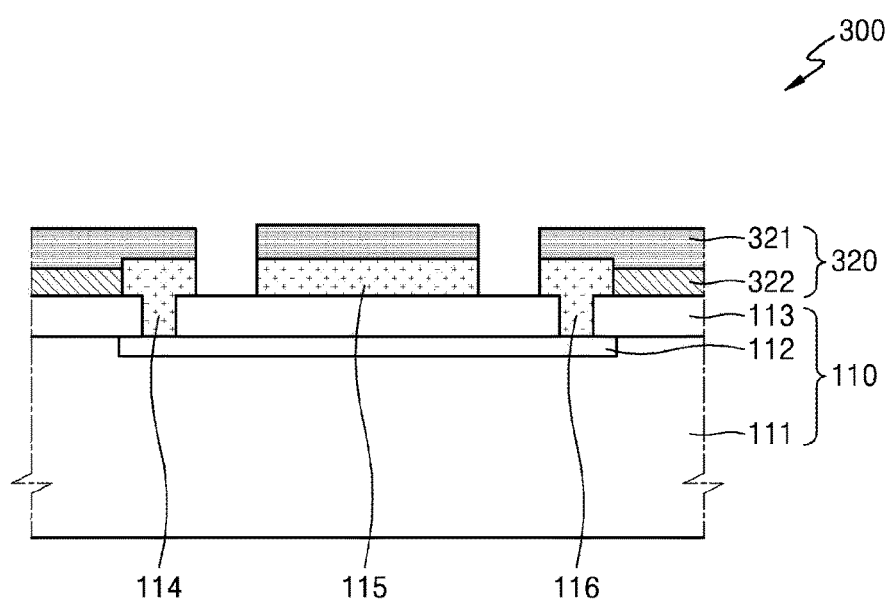
FIG. 3 is a cross-sectional view showing a schematic structure of a flexible device according to another example embodiment.

FIGS. 1 through 3 illustrate an example embodiment of a flexible device using a flexible interconnect layer connected in a single layer.

FIG. 1 is a cross-sectional view showing a schematic structure of a flexible device 100 according to an example embodiment. Referring to FIG. 1, the flexible device 100 according to the example embodiment may include an electronic device 110 and a first flexible interconnect layer 120.

The electronic device 110 may include a substrate 111, a channel layer 112 formed on the substrate 111, an insulator layer 113 formed on the substrate 111, a first electrode 114 passing through the insulator layer 113 to contact the channel layer 112, a second electrode 115 disposed on the insulator layer 113, and a third electrode 116 passing through the insulator layer 113 to contact the channel layer 112.

The substrate 111 may be a flexible substrate including a flexible material. The substrate 111 may include a flexible material such as, for example, a polymer. For example, the substrate 111 may include polyethylenenaphthalate (PEN), polyethyleneterephthalate (PET), polycarbonate, polyvinylalcohol, polyacrylate, polyimide, polynorbornene, polyethersulfone (PES), and so forth. However, the substrate 111 may not necessarily include a flexible material and may include a rigid material. In this case, the flexibility of the flexible device 100 may be provided by the flexible interconnect layer 120.

The first electrode 114, the second electrode 115, and the third electrode 116 may use a metallic material having high electric conductivity, for example, Pd, Pt, Ru, Au, Ag, Mo, Mg, Al, W, Ti, Ir, Ni, Cr, Nd, Cu, or the like. The first electrode 114, the second electrode 115, and the third electrode 116 may also use graphene or a transparent conductive metallic oxide such as indium tin oxide (ITO), indium zinc oxide (IZO), aluminum zinc oxide (AZO), gallium zinc oxide (GZO), or the like.

The insulator layer 113 may use, for example, a gate insulating layer material of a general semiconductor transistor, such as $SiO_2$, SiNx, $HfO_2$, $Al_2O_3$, $La_2O_3$, $ZrO_2$, HfSiO, HfSiON, HfLaO, LaAlO, SrTiO, or the like.

The first flexible interconnect layer 120 may include a first two-dimensional (2D) material layer 121, and a first conductive polymer layer 122 and a second conductive polymer layer 123 that are formed on both surfaces of the first 2D material layer 121. The first flexible interconnect layer 120 may be formed on each of the first electrode 114, the second electrode 115, and the third electrode 116. For electric connection with another electronic device, one end of the first flexible interconnect layer 120 contacts the first electrode 114 and extends in a direction away from the first electrode 114. For electric connection with another electronic device, one end of the first flexible interconnect layer 120 contacts the second electrode 115 and extends in a direction away from the second electrode 115. For electric connection with another electronic device, one end of the first flexible interconnect layer 120 contacts the third electrode 116 and extends in a direction away from the third electrode 116. Although not shown in FIG. 1, the first flexible interconnect layer 120 connected to the first electrode 114, the second electrode 115, and the third electrode 116 may be arranged to contact electrodes of another electronic device for electric connection.

Since internal electrodes of the electronic device 110 are electrically connected to each other, functions of the electronic device 110 are not shown, the first flexible interconnect layer 120 formed on the respective electrodes 114, 115, and 116 may be disposed not to contact other electrodes 114, 115, and 116 in the same electronic device 110.

Meanwhile, the first flexible interconnect layer 120 according to an example embodiment may be structured such that the first conductive polymer layer 122, the first 2D material layer 121, and the second conductive polymer layer 123 are arranged in that order from the electrodes 114, 115, and 116. The first 2D material layer 121 is formed of or include a material having high electric conductivity and may function as an interconnect line for electric connection. Thus, the first 2D material layer 121 may directly contact the first electrode 114, the second electrode 115, and the third electrode 116. However, if necessary, the first conductive polymer layer 122 and the second conductive polymer layer 123 may directly contact the first electrode 114, the second electrode 115, and the third electrode 116 to function as an interconnect line for electric connection.

The first 2D material layer 121 may be formed of or include a 2D material such as graphene or transition metal dichalcogenide (TMD). Graphene has high electric conductivity and high flexibility of a maximum of 20% of longitudinal extension, thus being suitable for an interconnect line. TMD also has high electric conductivity and high flexibility, thus being appropriate for an interconnect line. The first 2D material layer 121 may be formed by transferring graphene manufactured by chemical vapor deposition (CVD). The first 2D material layer 121 formed with graphene is a path through which carriers move, and may have a band gap of zero. The first 2D material layer 121 may be formed directly on the first conductive polymer layer 122. In this case, to substantially prevent damage of the first conductive polymer layer 122, a low-temperature process of 400° C. or below may be used.

The first conductive polymer layer 122 and the second conductive polymer layer 123 may use or include a polymer material having higher rigidity, flexibility, and elasticity than the first 2D material layer 121 to substantially prevent the first 2D material layer 121 from being damaged by contact with an external element, curved deformation, or loosening by an empty weight. The first conductive polymer layer 122 and the second conductive polymer layer 123 may form an interconnect line together with the first 2D material layer 121 by being coupled to both surfaces of the first 2D material layer 121. The first conductive polymer layer 122 and the second conductive polymer layer 123 may also protect the first 2D material layer 121 that is weak to an external shock. In particular, the first conductive polymer layer 122 and the second conductive polymer layer 123 may be formed of or include the same material and function as a buffer layer when enclosing the first 2D material layer 121. The first conductive polymer layer 122 and the second conductive polymer layer 123 may have flexibility, and thus may include, for example, 3,4-poly[3,4-ethylenedioxythiophene]-polystyrenesufonate. The first conductive polymer layer 122 and the second conductive polymer layer 123 may also include polyphenylenevinylene, polyacetylene, polythiophene, polypyrrole, polyphenylene sulfide, polyalkylthiophene, polyindole, polypyrene, polycarbazole, polyazulene, polyazepin, polynaphthalene, and other conductive polymers. Moreover, poly[3,4-ethylenedioxythiophene]-polystyrenesufonate) has transparency and thus may be included as a material for a transparent flexible device.

FIG. 2 is a cross-sectional view showing a schematic structure of a flexible device 200 according to another example embodiment. A first flexible interconnect layer 220 illustrated in FIG. 2 may include a first 2D material layer 221 and a first conductive polymer layer 222. Referring to FIG. 2, the first flexible interconnect layer 200 according to the example embodiment may be structured such that the first 2D material layer 221 and the first conductive polymer layer 222 are arranged in that order from the respective electrodes 114, 115, and 116.

FIG. 3 is a cross-sectional view showing a schematic structure of a flexible device 300 according to another example embodiment. A first flexible interconnect layer 320 illustrated in FIG. 3 may include a first 2D material layer 321 and a first conductive polymer layer 322. Referring to FIG. 3, the first flexible interconnect layer 320 according to the example embodiment may be structured such that the first conductive polymer layer 322 and the first 2D material layer 321 are arranged in that order from the respective electrodes 114, 115, and 116.

FIGS. 4 through 8 illustrate an example embodiment of a flexible device using a flexible interconnect layer connected in two layers.

Figure 4:
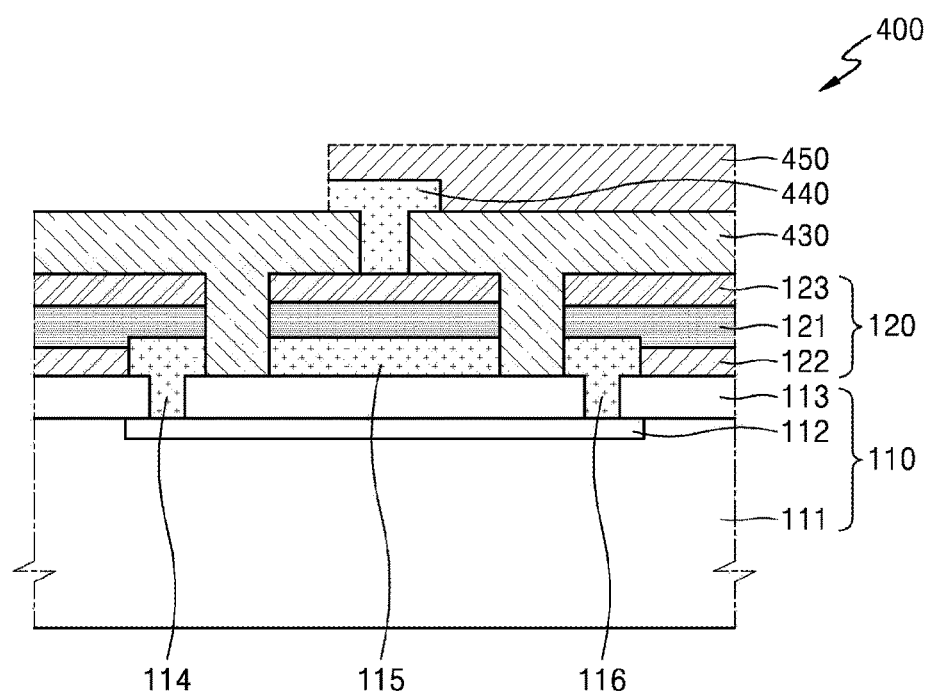
FIG. 4 is a cross-sectional view showing a schematic structure of a flexible device according to another example embodiment.

FIG. 4 is a cross-sectional view showing a schematic structure of a flexible device 400 according to another example embodiment. Referring to FIG. 4, the flexible device 400 may include the first flexible interconnect layer 120 and a second flexible interconnect layer 450. A low-dielectric constant dielectric layer 430 is provided between the first flexible interconnect layer 120 and the second flexible interconnect layer 450. A through electrode 440 contacts the first flexible interconnect layer 120 and the second flexible interconnect layer 450 through the low-dielectric constant dielectric layer 430, and electrically connects the first flexible interconnect layer 120 with the second flexible interconnect layer 450.

The low-dielectric constant dielectric layer 430 may block mutual electric connection between the first electrode 114, the second electrode 115, and the third electrode 116. The low-dielectric constant dielectric layer 430 may globally cover the electronic device 110 in which the first flexible interconnect layer 120 is formed on each of the first electrode 114, the second electrode 115, and the third electrode 116. The through electrode 440 is formed in a desired, or alternatively predetermined position on the first flexible interconnect layer 120 on the second electrode 115 to be connected in two layers, and the first flexible interconnect layer 120 and the second flexible interconnect layer 450 may be electrically connected by the through electrode 440.

The low-dielectric constant dielectric layer 430 may include a low-k dielectric substance. The low-k dielectric substance may include silicon oxide (SiOx) or a dielectric substance having a lower dielectric constant than silicon oxide, for example, a dielectric substance having a dielectric constant lower than 4. A reason for requiring a low dielectric constant for the low-dielectric constant dielectric layer 430 is because for a device, such as a central processing unit (CPU), in which a signal is transferred fast, due to movement of electric charges flowing through the first flexible interconnect layer 420, which is a mono-layer interconnect line, and the second flexible interconnect layer 450, which is a two-layer interconnect line, performance of the interconnect line may be degraded by accumulation of the electric charges in the dielectric layer 430 between the first flexible interconnect layer 420 and the second flexible interconnect layer 450. Thus, as the dielectric constant decreases, the effect of electric charge accumulation may also degrade, such that the low-dielectric constant dielectric layer 430 may be used.

The through electrode 440 may use a metallic material having high electric conductivity, for example, Pd, Pt, Ru, Au, Ag, Mo, Mg, Al, W, Ti, Ir, Ni, Cr, Nd, Cu, or the like. The through electrode 440 may also use graphene or a transparent conductive metallic oxide such as indium tin oxide (ITO), indium zinc oxide (IZO), aluminum zinc oxide (AZO), gallium zinc oxide (GZO), or the like.

Figure 5:
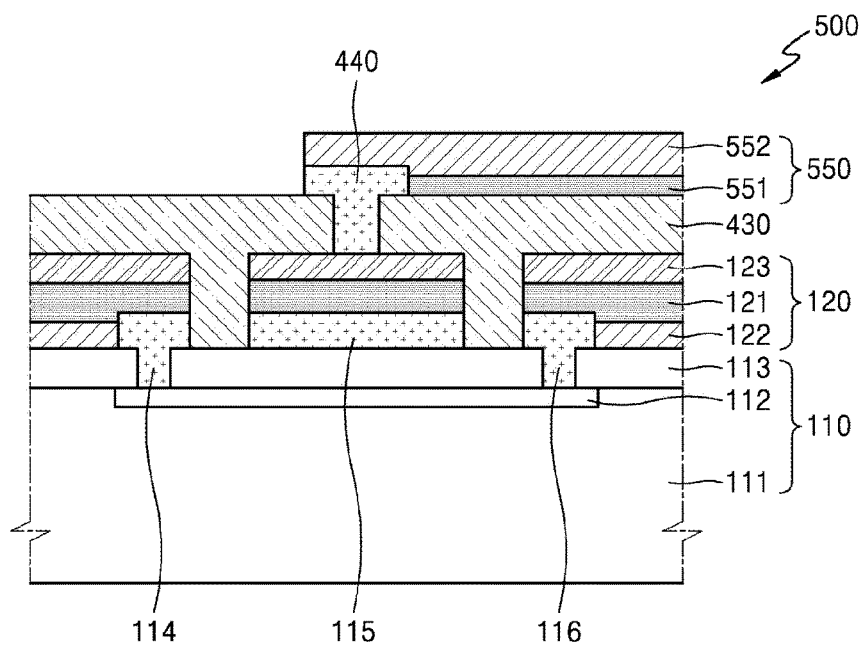
FIG. 5 is a cross-sectional view showing a schematic structure of a flexible device according to another example embodiment.

FIG. 5 is a cross-sectional view showing a schematic structure of a flexible device 500 according to another example embodiment. A second flexible interconnect layer 550 may be structured such that a second 2D material layer 551 and a third conductive polymer layer 552 may be disposed in that order from the through electrode 440.

Figure 6:
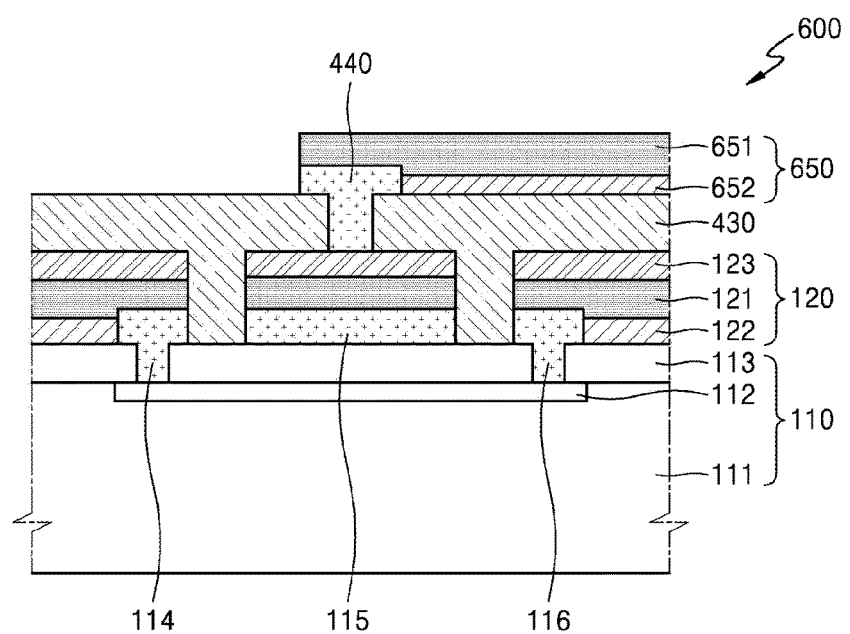
FIG. 6 is a cross-sectional view showing a schematic structure of a flexible device according to another example embodiment.

FIG. 6 is a cross-sectional view showing a schematic structure of a flexible device 600 according to another example embodiment. A second flexible interconnect layer 650 may be structured such that a third conductive polymer layer 652 and a second 2D material layer 651 may be arranged in that order from the through electrode 440.

Figure 7:
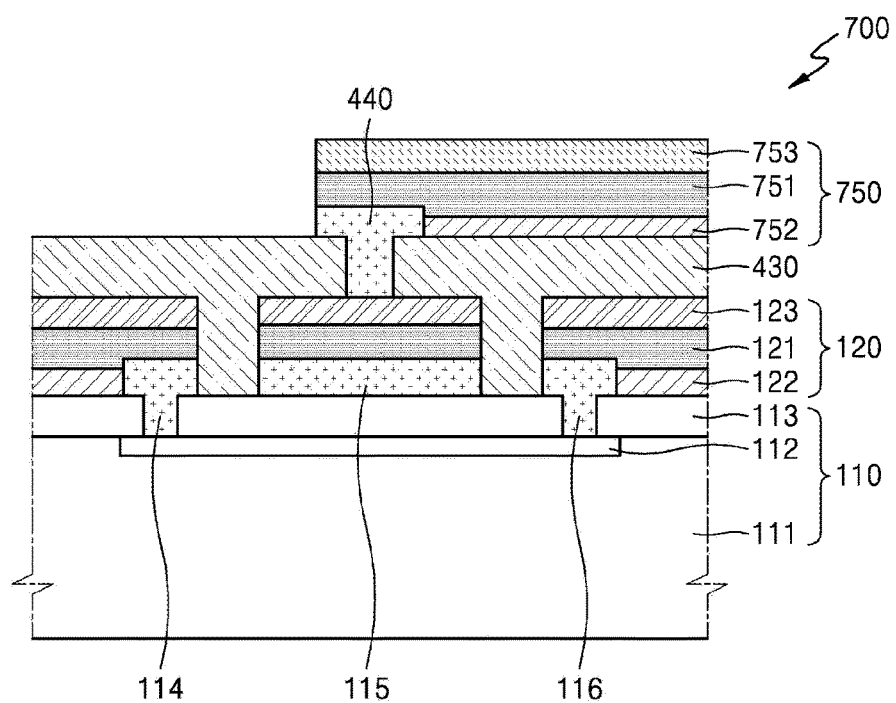
FIG. 7 is a cross-sectional view showing a schematic structure of a flexible device according to another example embodiment.

FIG. 7 is a cross-sectional view showing a schematic structure of a flexible device 700 according to another example embodiment. A second flexible interconnect layer 750 connected in two layers may be structured such that a third conductive polymer layer 752, a second 2D material layer 751, and a fourth conductive polymer layer 753 may be arranged in that order from the through electrode 440. In this case, the third conductive polymer layer 752 and the fourth conductive polymer layer 753 are buffer layers to improve stabilization of the flexible device 700.

Figure 8:
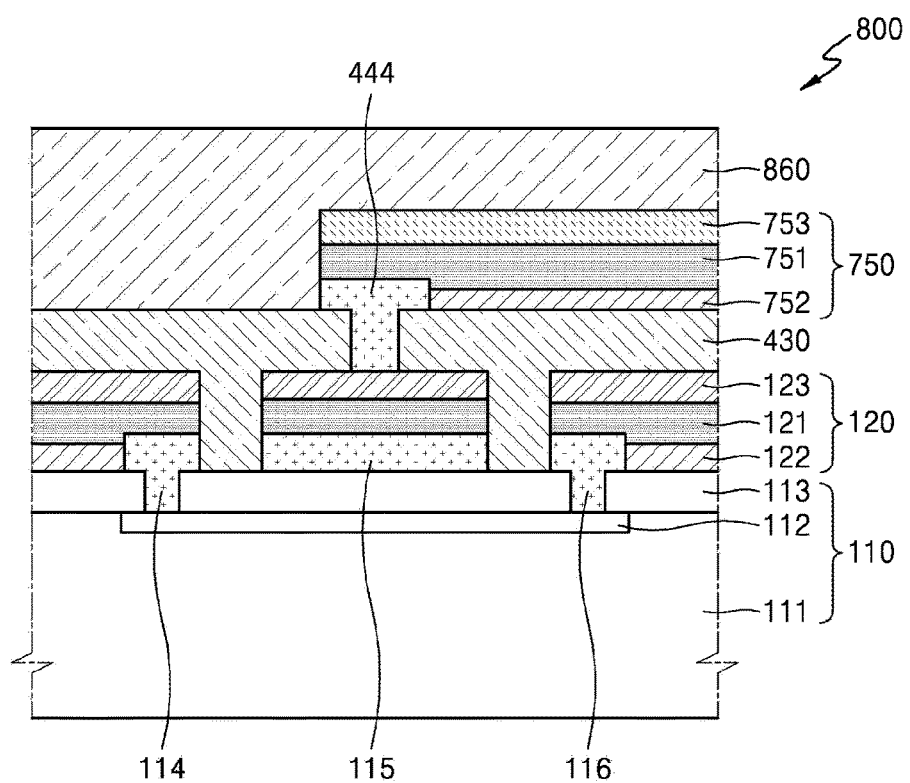
FIG. 8 is a cross-sectional view showing a schematic structure of a flexible device according to another example embodiment.

FIG. 8 is a cross-sectional view showing a schematic structure of a flexible device 800 according to another example embodiment. Referring to FIG. 8, a passivation layer 860 may be formed on a second flexible interconnect layer 850. The passivation layer 860 may protect the flexible device 800 from an external shock, anti-oxidation, anti-intrusion, and so forth. The passivation layer 860 may use an oxide layer, a high polymer such as PI, epoxy, or the like, or an elastic high polymer such as silicon elastomer. In FIG. 8, the passivation layer 860 is illustrated as being disposed as a monolayer, but the example embodiment is not limited to this example. The passivation layer 860 may also have a multilayer structure. In this case, each layer may have a different material, and each material may have a separate effect such as device protection, anti-intrusion of a foreign material, anti-oxidation, or the like.

When the substrate 111 and the passivation layer 860 are formed of or include the same material, they may contribute to stabilization of the flexible device 800 as a buffer layer. When the passivation layer 860 has a multilayer structure, the outermost layer of the passivation layer 860 may be formed of or include the same material as the substrate 111.

Figure 9:
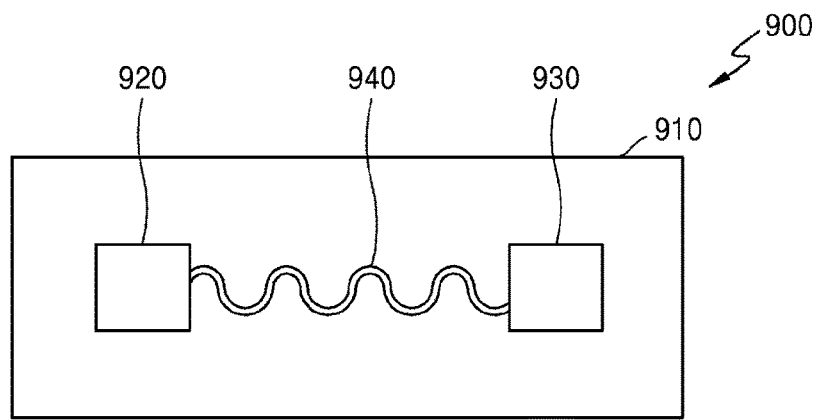
FIG. 9 is a plane view showing a schematic structure of a flexible device according to another example embodiment.

FIG. 9 is a plane view showing a schematic structure of a flexible device 900 according to another example embodiment. A flexible interconnect layer 940 has a 2D pattern and electrically connects an electrode 920 of a first electronic device and an electrode 930 of a second electronic device. A method of forming a 2D pattern may include forming a flexible interconnect layer 940 on a substrate 910 and then restoring the substrate 910 to the original length. When the substrate 910 is restored to the original length, the flexible interconnect layer 940 may have a curvy pattern due to stress. The advantage of the curvy pattern in a 2D form is the additional flexibility of the 2D pattern as well as the flexibility of the material. The flexible interconnect layer 940 may have a 3D pattern. When the flexible interconnect layer 940 has the 3D pattern, additional flexibility may be provided, but in this case, it may not be easy to form an additional flexible interconnect layer or low-dielectric constant dielectric layer on the flexible interconnect layer 940.

Figure 10:
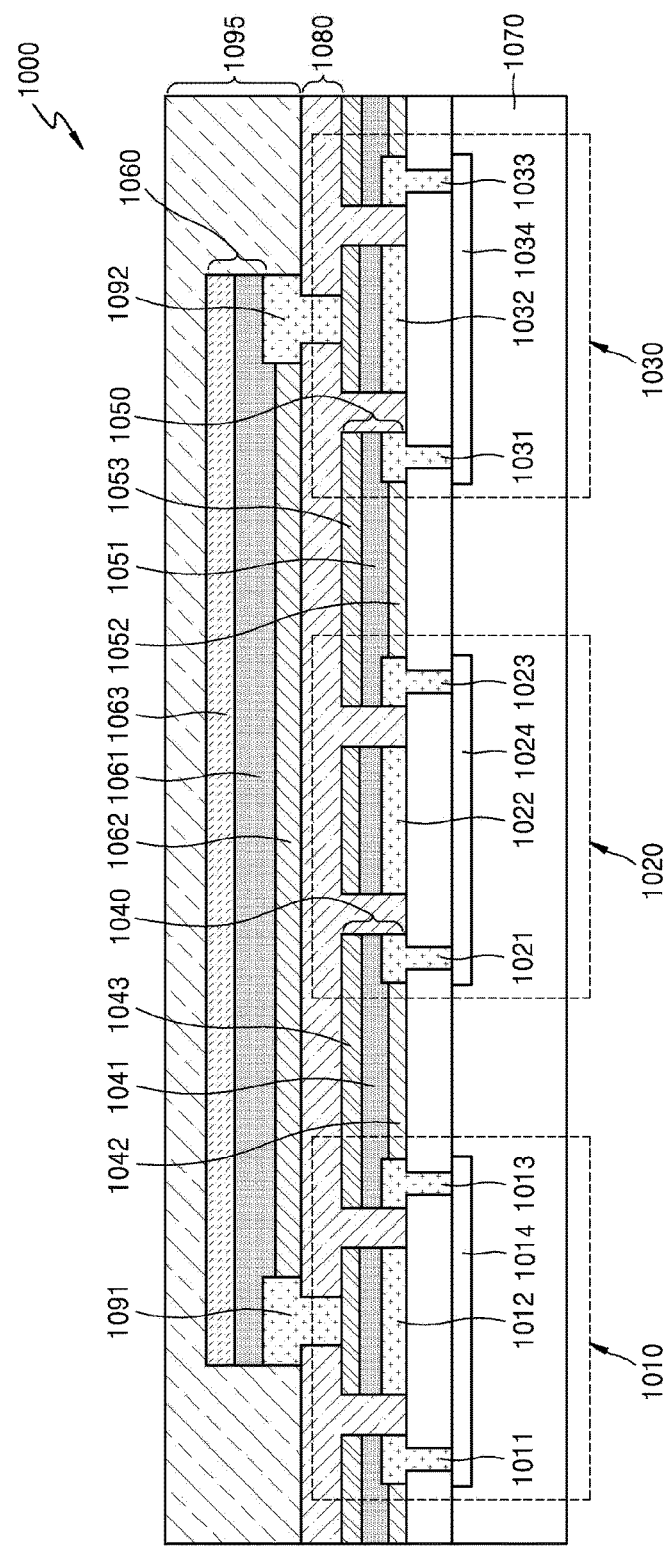
FIG. 10 is a cross-sectional view showing a schematic structure of a flexible device according to another example embodiment.

FIG. 10 is a cross-sectional view showing a schematic structure of a flexible device according to another example embodiment. Referring to FIG. 10, a flexible device 1000 may include a first electronic device 1010, a second electronic device 1020, and a third electronic device 1030 that are formed on a substrate 1070. The first electronic device 1010 may include a first electrode 1011, a second electrode 1012, and a third electrode 1013. The second electronic device 1020 may include a first electrode 1021, a second electrode 1022, and a third electrode 1023. The third electronic device 1030 may include a first electrode 1031, a second electrode 1032, and a third electrode 1033. The third electrode 1013 of the first electronic device 1010 may be connected to the first electrode 1021 of the second electronic device 1020 through a first flexible interconnect layer 1040 which may be a mono-layer interconnect line. The third electrode 1023 of the second electronic device 1020 and the first electrode 1031 of the third electronic device 1030 may be connected through a second flexible interconnect layer 1050 which may be a mono-layer interconnect line. The second electrode 1012 of the first electronic device 1010 may be connected to the second electrode 1032 of the third electronic device 1030 through a third flexible interconnect layer 1060 which may be a two-layer interconnect line. A through electrode 1091 is formed on a flexible interconnect layer stacked on the second electrode 1012 of the first electronic device 1010, and is connected to a third flexible interconnect layer 1060 which may be a two-layer interconnect line. A through electrode 1092 is formed on a flexible interconnect layer stacked on the second electrode 1032 of the third electronic device 1030 and is connected to the third flexible interconnect layer 1060 which is the two-layer interconnect line. A low-dielectric constant dielectric layer 1080 substantially prevents the first electrode 1011, the second electrode 1012, and the third electrode 1013 in the first electronic device 101 from being connected to each other, and substantially surrounds the first flexible interconnect layer 1040 and the second flexible interconnect layer 1050, which correspond to a complete mono-layer interconnect line, to substantially prevent electric connect with the third flexible interconnect line 1060 which is a two-layer interconnect line.

Although not shown in FIG. 10, the first electrode 1011 of the first electronic device 1010, the second electrode 1022 of the second electronic device 1020, and the third electrode 1033 of the third electronic device 1030 may also be connected to an electrode of another electronic device on the flexible device 1000 through respective flexible interconnect layers. Referring to FIG. 10, the first flexible interconnect layer 1040 and the second flexible interconnect layer 1050 may be formed on the first layer of the flexible device 1000, and the third flexible interconnect layer 1060 may be formed on the second layer. However, this configuration is merely an example and, if necessary, an interconnect line of three or more layers may be disposed. The first flexible interconnect layer 1040 may include a first 2D material layer 1041 and a first conductive polymer layer 1042 and a second conductive polymer layer 1042 that are formed on both surfaces of the first 2D material layer 1041. The second flexible interconnect layer 1050 may include a second 2D material layer 1051, and a third conductive polymer layer 1052 and a fourth conductive polymer layer 1053 that are formed on both surfaces of the second 2D material layer 1051. The third flexible interconnect layer 1060 may include a third 2D material layer 1061, and a fifth conductive polymer layer 1062 and a sixth conductive polymer layer 1063 that are formed on both surfaces of the third 2D material layer 1061. A passivation layer 1095 may be further formed on the third flexible interconnect layer 1060 to protect the flexible device 1000. The passivation layer 1095 may be formed of or include the same material as the substrate 1070.

FIGS. 11A through 11D are cross-sectional views showing a process of forming a flexible device according to an example embodiment.

Figure 11A:
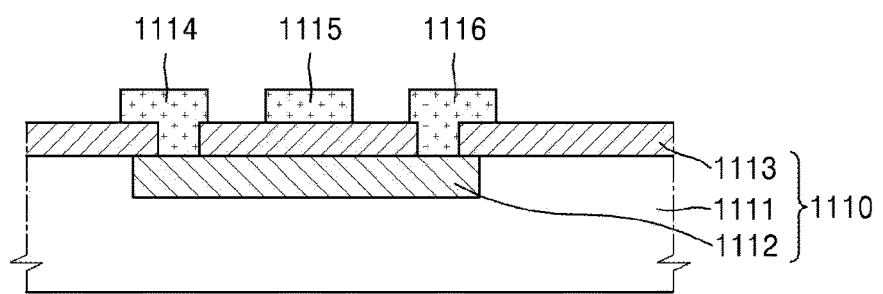
FIGS. 11A through 11D are cross-sectional views showing a process of manufacturing a flexible device according to an example embodiment.

Referring to FIG. 11A, an electronic device 1110 may be provided on a substrate 111. The electronic device 1110 may include the substrate 1111, a channel layer 1112 formed in the substrate 1111, a dielectric layer 1113 formed on the substrate 1111, a first electrode 1114 passing through the dielectric layer 1113 to contact the channel layer 1112, a second electrode 1115 disposed on the dielectric layer 1113, and a third electrode 1116 passing through the dielectric layer 1113 to contact the channel layer 1112. The electronic device 1110 may include a transistor, a barrister, FinFET, or the like, but a type thereof is not specially limited.

Figure 11B:
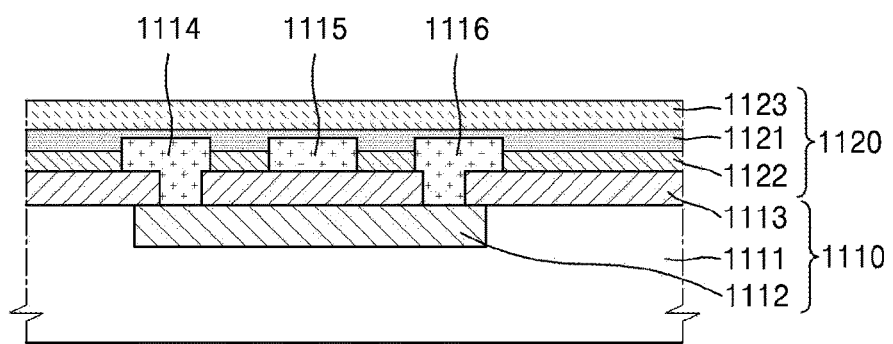

Next, referring to FIG. 11B, the first flexible interconnect layer 1120 globally covering the electronic device 1110 may be formed. The first flexible interconnect layer 1120 may include a first conductive polymer layer 1122, a first 2D material layer 1121, and a second conductive polymer layer 1123.

To form the first flexible interconnect layer 1120, the first conductive polymer layer 1122 may be formed first on the electronic device 1110. The first conductive polymer layer 1122 may be formed using, for example, spin coating. The first conductive polymer layer 1122 is illustrated as being formed in areas between the first electrode 1114, the second electrode 1115, and the third electrode 1116 on the dielectric layer 1113, but this illustration is merely an example, and the first conductive polymer layer 1122 may be formed on the first electrode 1114, the second electrode 1115, and the third electrode 1116.

Thereafter, the first 2D material layer 1121 may be formed on the first conductive polymer layer 1122. The material of the first 2D material layer 1121 may include graphene or a transition-metal dichalcogenide (TMD). The first 2D material layer 1121 may be formed using a direct growth or general transfer method. For the direct growth method, to substantially prevent damage of the first conductive polymer 1122, a low-temperature process below 400° C. may be used. The second conductive polymer layer 1123 may then be formed on the first 2D material layer 1121. The second conductive polymer layer 1123 may be formed using spin coating.

Figure 11C:
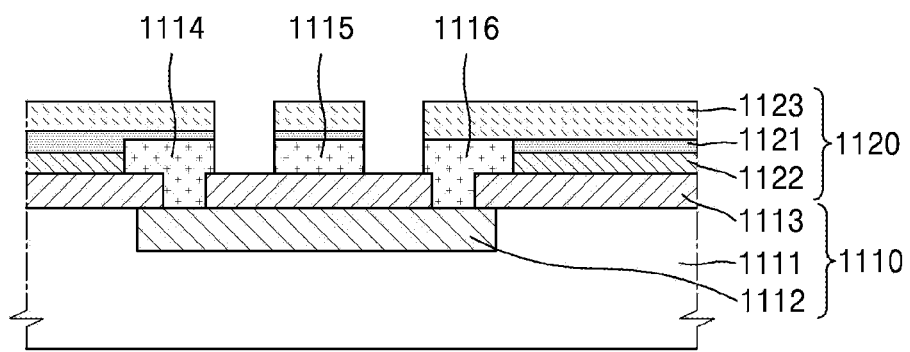

Next, as illustrated in FIG. 11C, the first flexible interconnect layer 1120 may be patterned. The patterned form may be a form for functioning as electric interconnection for connection with another electronic device. For example, an end of the first flexible interconnect layer 1120 may contact the first electrode 1114 and may be patterned to extend in a direction away from the first electrode 1114. The patterning method may be photolithography using photoresist. In addition, a typical semiconductor patterning method may be used.

Figure 11D:
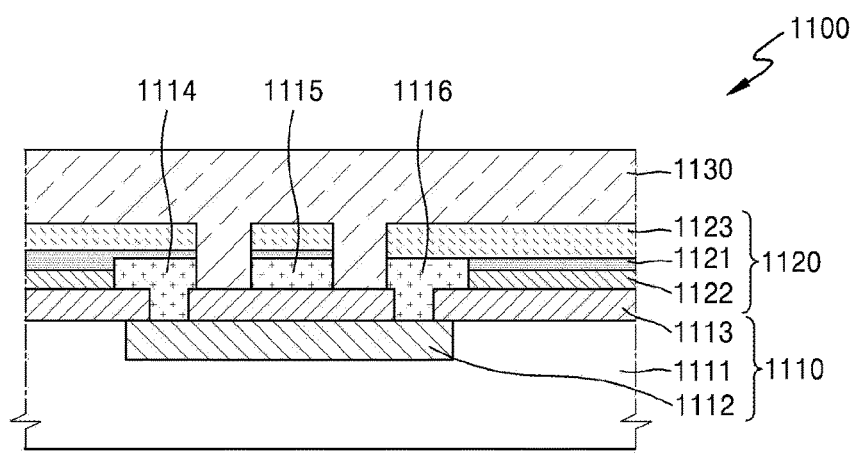

Referring to FIG. 11D, a passivation layer 1130 may be formed on the first flexible interconnect layer 1120. The passivation layer 1130 may use or include an oxide layer, a high molecule such as PI, Epoxy, or the like, or high elastic constant polymer such as a silicon elastomer. The passivation layer 1130 may be formed using, for example, typical spin coating.

FIGS. 12A through 12E are cross-sectional views showing a process of manufacturing a flexible device 1200 according to another example embodiment. In particular, FIGS. 12A through 12D show a process of forming the flexible device 1200 in which a flexible interconnect layer is used in two layers.

Figure 12A:
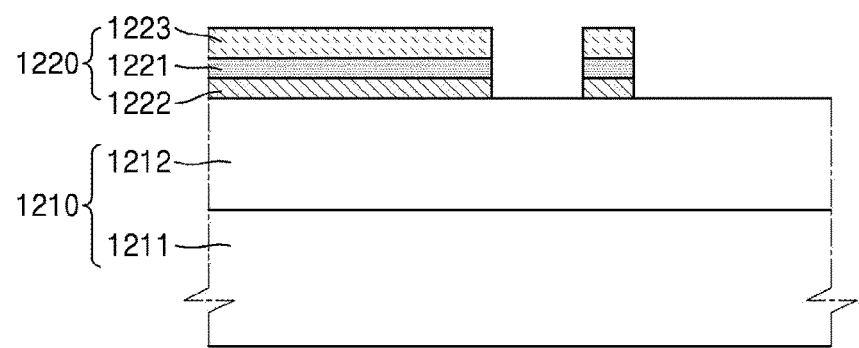
FIGS. 12A through 12E are cross-sectional views showing a process of manufacturing a flexible device according to another example embodiment.

First, referring to FIG. 12A, on a substrate 1211 and a dielectric layer 1212 formed on the substrate 1211, a first flexible interconnect layer 1220 may be provided in which interconnect line patterning is completed. The flexible device 1200 illustrated in FIG. 12A may be a front end of line (FEOL), which is a part of an integrated circuit (IC) in which a separate device such as a transistor, a condenser, or the like is patterned. Although not shown in FIG. 12A, the first flexible interconnect layer 1220 may be electrically connected to an electrode of a separate electronic device such as a transistor or the like.

Figure 12B:
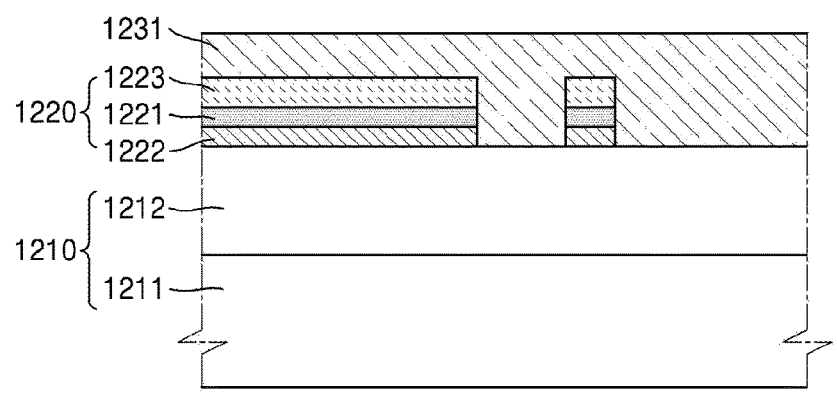

Referring to FIG. 12B, a low-dielectric constant dielectric layer 1231 may be formed on the first flexible interconnect layer 1220. The low-dielectric constant dielectric layer 1231 may be a dielectric substance having a dielectric constant of 4 or less and mainly includes silicon oxide. The low-dielectric constant dielectric layer 1231 may be formed using a proper method according to materials, and silicon oxide may be formed using sputtering.

Figure 12C:
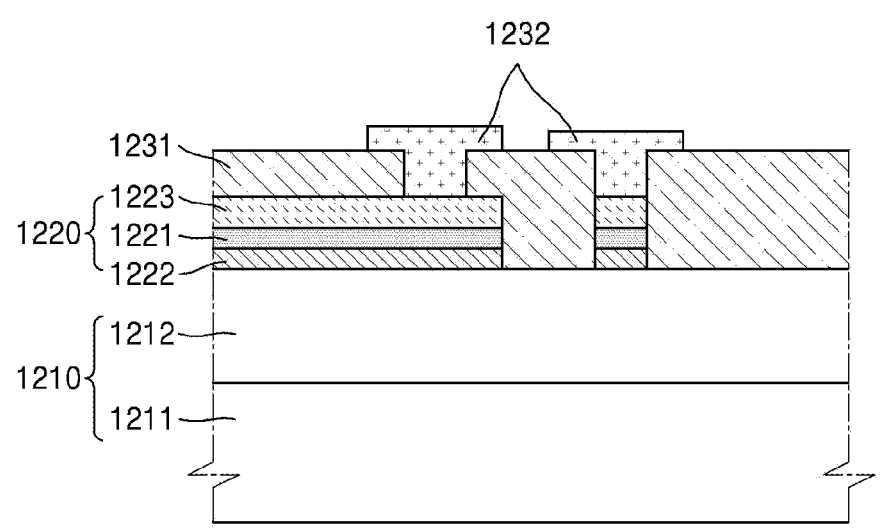

Referring to FIG. 12C, for contact with a second flexible interconnect layer 1240 which is a two-layer interconnect line, a through electrode 1232 may be formed to pass through the low-dielectric constant dielectric layer 1231 and to contact the first flexible interconnect layer 1220. The through electrode 1232 mainly includes metal, but may also use graphene or a conductive oxide having transparency.

Figure 12D:
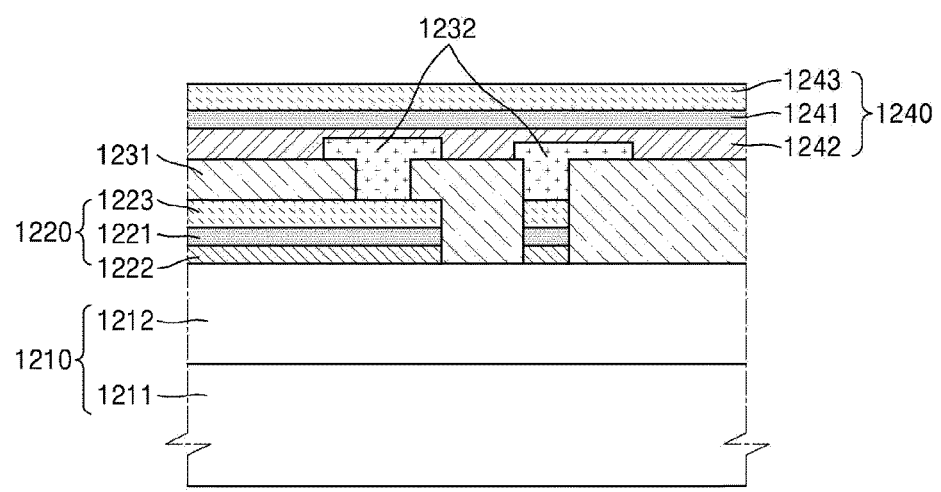

Referring to FIG. 12D, the second flexible interconnect layer 1240 may be formed on the through electrode 1232 for two-layer connection. First, a third conductive polymer layer 1242 is formed on the through electrode 1232. The third conductive polymer layer 1242 may be formed using spin coating. Thereafter, a material of a second 2D material layer 1241 may include graphene or a transition metal dichalcogenide (TMD). The second 2D material layer 1241 may be formed using a direct growth or typical transfer method. For the direct growth method, to substantially prevent damage of a conductive polymer, a low-temperature process of 400° C. or below may be used. A fourth conductive polymer layer 1243 may be formed on the second 2D material layer 1241. The fourth conductive polymer layer 1243 may be formed using spin coating.

Figure 12E:
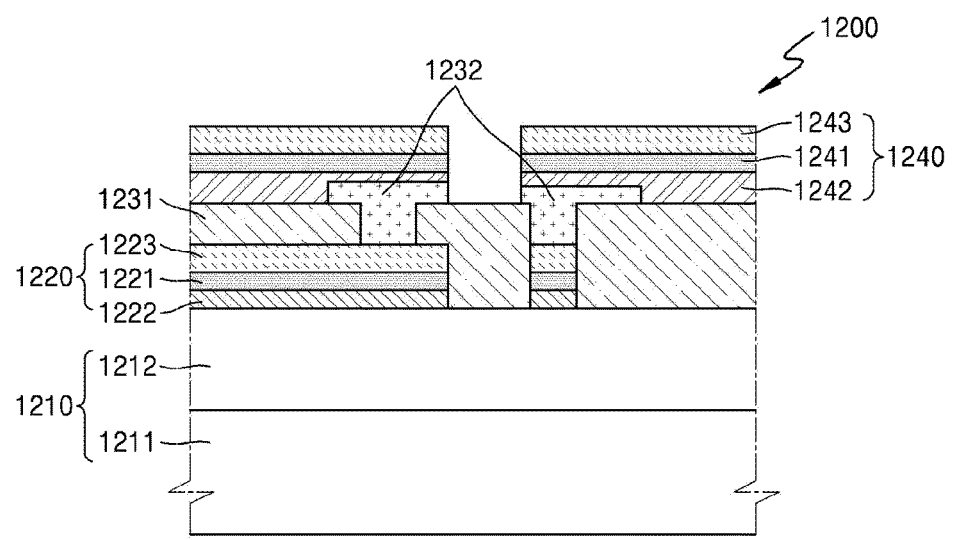

Referring to FIG. 12E, interconnect line patterning may be performed to allow the second flexible interconnect layer 1240 to serve as electric interconnection. The patterning may be photolithography using photoresist. In addition, typical semiconductor pattering may be used.

The above-described flexible interconnect layer may include a 2D material layer and a conductive polymer to have high electric conductivity and flexibility. The flexible interconnect layer may be formed using general patterning. By using a conductive polymer having transparency, a transparent flexible device may be used.

The flexible device including the flexible interconnect layer may be used as a wearable device.

So far, an example embodiment of a flexible device using a flexible interconnect layer including a 2D material has been described and illustrated in the attached drawings. However, the example embodiment is merely intended as a description, and it should be understood that the example embodiment does not limit the present disclosure. It should also be understood that the example embodiment is not limited to the illustrated and provided description. This is because other various modifications may be made by those of ordinary skill in the art.

It should be understood that example embodiments described herein should be considered in a descriptive sense only and not for purposes of limitation. Descriptions of features within each example embodiment should typically be considered as available for other similar or same features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A flexible device comprising:
   a substrate;
   an electronic device on the substrate and including an electrode; and
   a first flexible interconnect layer on the electrode and including a first two-dimensional (2D) material layer, wherein the first two-dimensional (2D) material layer is configured to interconnect the electronic device with another electronic device, a first conductive polymer layer on the first 2D material layer and a second conductive polymer layer;

wherein the first 2D material layer includes at least one of graphene and transition-metal dichalcogenide (TMD); and wherein the first conductive polymer layer, the first 2D material layer, and the second conductive polymer layer are arranged in sequence from the electrode.

2. The flexible device of claim 1, wherein the first flexible interconnect layer comprises a pattern configured for electrical interconnection.

3. The flexible device of claim 2, wherein the pattern comprises a two-dimensional (2D) pattern.

4. The flexible device of claim 1, further comprising:
a low-dielectric constant dielectric layer on the first flexible interconnect layer;
a through electrode passing through the low-dielectric constant dielectric layer and contacting the first flexible interconnect layer; and
a second flexible interconnect layer on the through electrode and including a second 2D material layer and a third conductive polymer layer on the second 2D material layer.

5. The flexible device of claim 4, wherein the second flexible interconnect layer is configured such that the second 2D material layer and the third conductive polymer layer are arranged in sequence from the through electrode.

6. The flexible device of claim 4, wherein the second flexible interconnect layer is configured such that the third conductive polymer layer and the second 2D material layer are arranged in sequence from the through electrode.

7. The flexible device of claim 4, wherein the second flexible interconnect layer further comprises a fourth conductive polymer layer, and is configured such that the third conductive polymer layer, the second 2D material layer, and the fourth conductive polymer layer are arranged in sequence from the through electrode.

8. The flexible device of claim 1, wherein the first conductive polymer layer comprises a flexible polymer.

9. The flexible device of claim 8, wherein the flexible polymer comprises at least one of 3,4-ethylenedioxythiophene, polyaniline, 3,4-poly[3,4-ethylenedioxythiophene]-polystyrenesufonate (PEDOT), polyphenylenevinylene, polyacetylene, polythiophene, polypyrrole, polyphenylene sulfide, polyalkylthiophene, polyindole, and polypyrene.

10. The flexible device of claim 1, further comprising a passivation layer configured to protect the flexible device.

11. The flexible device of claim 10, wherein the passivation layer comprises a same material as the substrate.

12. The flexible device of claim 10, wherein the passivation layer comprises at least one of an oxide layer, PI, epoxy, and a silicon elastomer.

13. The flexible device of claim 1, wherein the substrate comprises at least one of polyethylenenaphthalate (PEN), polyethyleneterephthalate (PET), polycarbonate, polyvinylalcohol, polyacrylate, polyimide, and polynorbornene, polyethersulfone (PES).

14. A flexible device comprising:
a first electronic device and a second electronic device spaced apart from each other; and
a first flexible interconnect layer connecting an electrode of the first electronic device to an electrode of the second electronic device and including a two-dimensional (2D) material layer, wherein the two-dimensional (2D) material layer is configured to interconnect the first electronic device with the second electronic device, a first conductive polymer layer on the 2D material layer and a second conductive polymer layer;
wherein the first 2D material layer includes at least one of graphene and transition-metal dichalcogenide (TMD); and
wherein the first conductive polymer layer, the 2D material layer, and the second conductive polymer layer are arranged in sequence from the electrode.

15. The flexible device of claim 14, further comprising:
a low-dielectric constant dielectric layer on the first flexible interconnect layer;
a through electrode through the low-dielectric constant dielectric layer and contacting the first flexible interconnect layer; and
a second flexible interconnect layer on the through electrode and including a 2D material layer and a third conductive polymer layer on the 2D material layer.

16. The flexible device of claim 15, further comprising a third electronic device electrically connected to the second flexible interconnect layer.

* * * * *